(12) United States Patent
Kim

(10) Patent No.: US 7,791,195 B2
(45) Date of Patent: Sep. 7, 2010

(54) BALL GRID ARRAY (BGA) PACKAGE AND METHOD THEREOF

(75) Inventor: Shin Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 502 days.

(21) Appl. No.: 11/431,703

(22) Filed: May 11, 2006

(65) Prior Publication Data

US 2007/0102816 A1 May 10, 2007

(30) Foreign Application Priority Data

Nov. 8, 2005 (KR) ...................... 10-2005-0106358

(51) Int. Cl.
*H01L 23/48* (2006.01)
*H01L 23/12* (2006.01)

(52) U.S. Cl. .............................. 257/737; 257/E23.069; 257/E23.023; 257/778; 257/779; 257/780; 257/772; 257/782; 257/781; 257/738

(58) Field of Classification Search ................. 257/778, 257/779, 780, 772, 782, 781, 784, 786, 737, 257/734, 738, E23.069, E23.023, E23.511
See application file for complete search history.

(56) References Cited

U.S. PATENT DOCUMENTS

| 5,705,858 | A  | * | 1/1998  | Tsukamoto      | 257/778 |
| 6,137,184 | A  | * | 10/2000 | Ikegami        | 257/785 |
| 6,229,209 | B1 | * | 5/2001  | Nakamura et al.| 257/737 |
| 6,320,127 | B1 | * | 11/2001 | Nagarajan et al.| 174/557 |
| 6,335,571 | B1 | * | 1/2002  | Capote et al.  | 257/787 |
| 6,384,343 | B1 | * | 5/2002  | Furusawa       | 174/260 |
| 6,462,425 | B1 | * | 10/2002 | Iwasaki et al. | 257/780 |
| 6,538,335 | B2 | * | 3/2003  | Shimada et al. | 257/780 |
| 6,583,517 | B1 | * | 6/2003  | Jimarez        | 257/781 |
| 6,713,844 | B2 | * | 3/2004  | Tatsuta et al. | 257/629 |
| 6,852,564 | B2 | * | 2/2005  | Ohuchi et al.  | 438/68  |
| 6,861,744 | B2 | * | 3/2005  | Hayama et al.  | 257/700 |
| 6,875,634 | B2 | * | 4/2005  | Shim et al.    | 438/108 |
| 6,984,877 | B2 | * | 1/2006  | Lee et al.     | 257/666 |
| 7,427,558 | B2 | * | 9/2008  | Kim et al.     | 438/613 |
| 2001/0053598 | A1 | * | 12/2001 | Koyama      | 438/613 |
| 2002/0003299 | A1 | * | 1/2002  | Nakamura et al. | 257/734 |
| 2002/0011677 | A1 | * | 1/2002  | Yokoi et al.   | 257/782 |
| 2002/0014703 | A1 | * | 2/2002  | Capote et al.  | 257/778 |
| 2002/0039644 | A1 | * | 4/2002  | Kimbara et al. | 428/209 |
| 2002/0069523 | A1 | * | 6/2002  | Arai           | 29/830  |
| 2002/0094604 | A1 | * | 7/2002  | Hayama et al.  | 438/108 |

(Continued)

FOREIGN PATENT DOCUMENTS

JP    2002-309526    * 10/2002

(Continued)

*Primary Examiner*—Alexander O Williams
(74) *Attorney, Agent, or Firm*—Harness, Dickey & Pierce, P.L.C.

(57) ABSTRACT

A board structure, a ball grid array (BGA) package and method thereof and a solder ball and method thereof. The example solder ball may include a solder portion and a grooved connection portion, formed through a partitioning process, configured to fit a corresponding protruding portion on a board. The example BGA package may include a plurality of the example solder balls. The example board structure may include the example BGA package connected to the board via the grooved connection portions and the protruding portions.

18 Claims, 7 Drawing Sheets

U.S. PATENT DOCUMENTS

| | | | | |
|---|---|---|---|---|
| 2002/0121706 A1* | 9/2002 | Tatsuta et al. | ................ | 257/778 |
| 2002/0185719 A1* | 12/2002 | Choi | .......................... | 257/678 |
| 2003/0092219 A1* | 5/2003 | Ohuchi et al. | ............... | 438/110 |
| 2003/0094692 A1* | 5/2003 | Ho et al. | ..................... | 257/718 |
| 2003/0096514 A1* | 5/2003 | Ho et al. | ....................... | 439/70 |
| 2003/0160325 A1* | 8/2003 | Yoneda et al. | ............... | 257/758 |
| 2004/0018753 A1* | 1/2004 | Kung et al. | ................... | 439/66 |
| 2005/0012195 A1* | 1/2005 | Go et al. | ...................... | 257/686 |
| 2005/0230824 A1* | 10/2005 | Watanabe et al. | ........... | 257/735 |
| 2006/0220230 A1* | 10/2006 | Tanaka et al. | ................ | 257/723 |
| 2007/0108627 A1* | 5/2007 | Kozaka et al. | .............. | 257/778 |
| 2008/0202803 A1* | 8/2008 | Nagase et al. | ................ | 174/262 |

FOREIGN PATENT DOCUMENTS

| | | |
|---|---|---|
| JP | 2003-152002 | 5/2003 |
| KR | P1997-0013242 | 3/1997 |
| KR | 10-2003-0059957 | 7/2003 |

\* cited by examiner

US 7,791,195 B2

BALL GRID ARRAY (BGA) PACKAGE AND METHOD THEREOF

PRIORITY STATEMENT

This application claims benefit of priority under 35 USC §119 from Korean Patent Application No. 10-2005-0106358, filed on Nov. 8, 2005, in the Korean Intellectual Property Office, the contents of which are incorporated herein by reference in its entirety.

BACKGROUND OF THE INVENTION

1. Field of the Invention

Example embodiments of the present invention relate generally to a board structure, a ball grid array (BGA) package and method thereof and a solder ball and method thereof.

2. Description of the Related Art

Conventional leads may be used as external connection terminals for semiconductor packages. More recently, ball-grid array (BGA) packages, which may include solder balls, may be employed instead of leads as external connection terminals. Conventional BGA packages may include a higher fabrication density (e.g., a higher number of external connection terminals in a smaller surface area) as compared to conventional lead packages, and further may be more easily mounted on a board. Conventional BGA packages may also aid in reducing a fabrication size of semiconductor packages.

FIG. 1 is a cross-sectional view illustrating a conventional BGA package 10. Referring to FIG. 1, the BGA package 10 may be a fine pitch ball grid array (FBGA) package 10. A semiconductor chip 14 may be mounted on a printed circuit board 12 with an adhesive tape. Pads (not shown) of the semiconductor chip 14 may be connected to bond fingers of the printed circuit board 12 through wires 18. The semiconductor chip 14 and the wires 18 on the printed circuit board 12 may be sealed by an encapsulation resin 16 (e.g., an epoxy mold compound (EMC)). Beneath the printed circuit board 12, solder balls 20 may be attached as external connection terminals.

FIG. 2 is a flowchart illustrating a method for fabricating the conventional BGA package 10 of FIG. 1. Referring to FIG. 2, a printed circuit board for BGA fabrication upon which a semiconductor chip may be mounted may be provided (at S10). The semiconductor chip may be mounted on the printed circuit board using an adhesion element such as adhesive tape (at S20). A wire bonding process may be performed to connect pads of the semiconductor chip to bond fingers of the printed circuit board through wires (at S30). After the wire bonding process is completed, a molding process may be performed to mold both the semiconductor chip and the wires on the printed circuit board using an encapsulation resin (at S40). Solder balls may be attached beneath the printed circuit board (at S50).

FIG. 3 is a cross-sectional view illustrating the conventional BGA package 10 of FIG. 1 mounted on a board 40. Referring to FIG. 3, solder balls 20, which may function as external connection terminals beneath the board 40 may adhere to circuit patterns 30 on the board 40 (e.g., with an adhesive) to form an electrical connection between the board 40 and the BGA package 10. Here, an under-fill (not shown) such as epoxy may fill in any remaining space between the board 40 and the BGA package 10.

However, in the BGA package 10 of FIGS. 1-3, defects (e.g., cracks of the solder balls) may arise due to a difference in coefficients of thermal expansion (CTE) between different materials positioned in proximity to where the solder balls 29 may adhere. Thus, the solder balls may, in certain cases, detach or fail to attach sufficiently to the printed circuit board. Further, because scaling down solder ball sizes may increase a severity or quantity of solder ball defects, it may be difficult to reduce solder ball sizes without compromising fabrication quality.

SUMMARY OF THE INVENTION

An example embodiment of the present invention is directed to a ball grid array (BGA) package, including a semiconductor chip mounted on a first surface of a printed circuit board, a connection element connecting the printed circuit board to the semiconductor chip, a plurality of solder balls attached to a second surface of the printed circuit board, each of the plurality of solder balls including a grooved connection, an encapsulation resin covering one or more of the printed circuit board, the semiconductor chip, the connection element, and the solder balls.

Another example embodiment of the present invention is directed to a method for fabricating a BGA package, including mounting a semiconductor chip on a first surface of a printed circuit board, connecting the semiconductor chip to the printed circuit board, attaching solder balls to a second surface of the printed circuit board, forming an encapsulation resin on the printed circuit board to so as to cover at least a portion of the first surface and the solder balls on the second surface and forming grooved connections in the encapsulation resin and the solder balls.

Another example embodiment of the present invention is directed to a board structure, including a board including a plurality of protruded connection pins, the protruded connection pins being formed corresponding to grooved connection portions of solder balls of a ball-grid array (BGA) package.

Another example embodiment of the present invention is directed to a solder ball, including a solder portion and a grooved connection portion, the grooved connection portion configured to fit a corresponding protruding portion on a board.

Another example embodiment of the present invention is directed to a ball grid array (BGA) package having grooved connections, which is capable of increasing solder joint reliability (SJR) of solder balls, allowing for laying out solder balls at fine intervals, and suppressing coming-off of solder balls.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
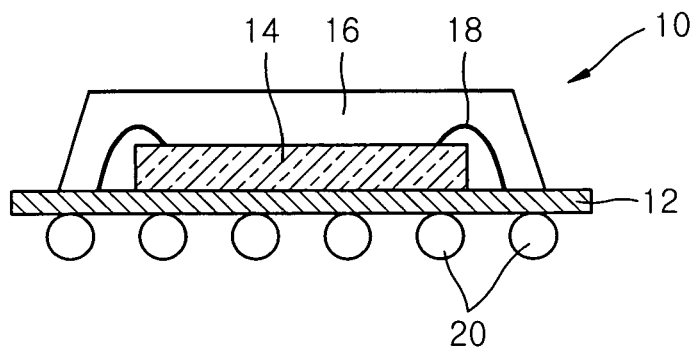
FIG. 1 is a cross-sectional view illustrating a conventional ball grid array (BGA) package.
Figure 2:
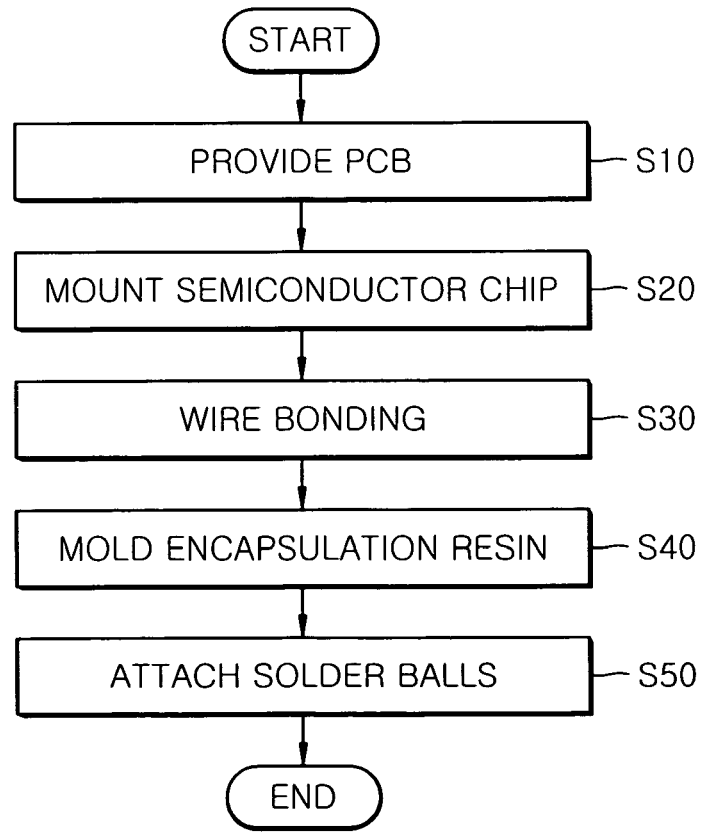
FIG. 2 is a flowchart illustrating a method for fabricating the conventional BGA package of FIG. 1.
Figure 3:
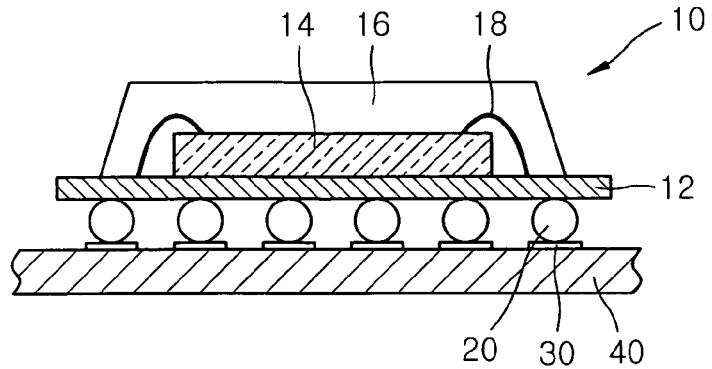
FIG. 3 is a cross-sectional view illustrating the conventional BGA package of FIG. 1 mounted on a board.

Example embodiments of the present invention are described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
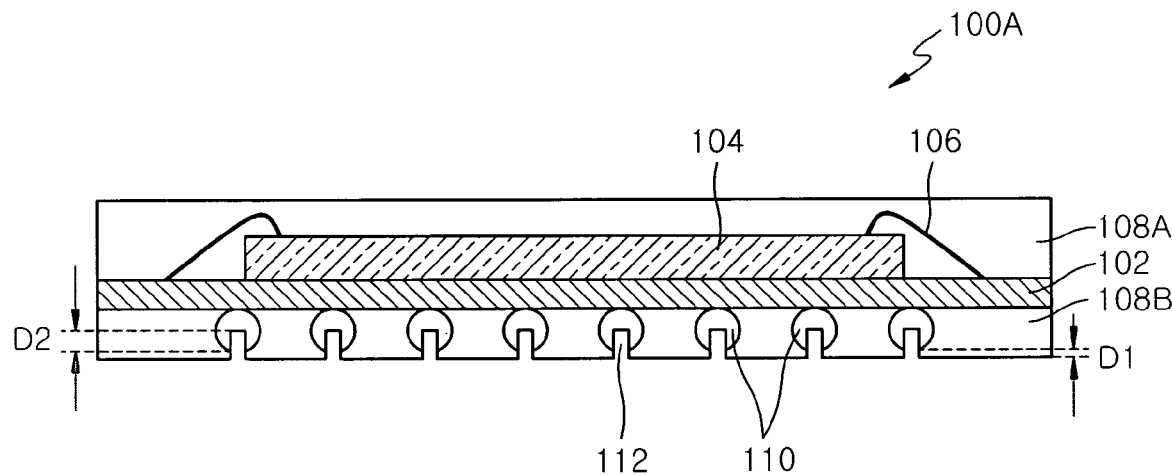
FIG. 4 is a cross-sectional view illustrating a fine pitch ball grid array (FBGA) package according to an example embodiment of the present invention.

FIG. 4 is a cross-sectional view illustrating a fine pitch ball grid array (FBGA) package 100A according to an example embodiment of the present invention.

In the example embodiment of FIG. 4, the FBGA package 100A may include a printed circuit board 102 used as a base member. In an example, the printed circuit board 102 may be one of a single-sided substrate, a double-sided substrate and a multilayer wiring substrate. In an alternative example, the printed circuit board 102 may be a rigid substrate including an insulating material (e.g., such as FR4 or BT resin) as a base and/or a flexible material layer such as a polyimide. The printed circuit board 102 may include a first surface upon which a semiconductor chip 104 may be mounted. The printed circuit board 102 may further include a second surface upon which a plurality of solder balls 110 may be attached. In an example, the second surface may be "lower" than or beneath the first surface on the printed circuit board 102 of FIG. 4.

In the example embodiment of FIG. 4, the semiconductor chip 104 may have pads for wire-bonding at an edge thereof.

The FBGA package 100A may include connections (e.g., wires 106) providing an electrical connection between the printed circuit board 102 and the pads of the semiconductor chip 104, and the plurality of solder balls 110 attached to the second surface of the printed circuit board 102.

In the example embodiment of FIG. 4, the FBGA package 100A may further include first and second encapsulation resins 108A and 108B for covering the printed circuit board 102, the semiconductor chip 104, the wires 106 and the plurality of solder balls 110. The FBGA package 100A may further include "grooved" connections 112, for example, formed by cutting one end of each of the plurality of solder balls 110 covered with the encapsulation resin 108B. The encapsulation resin 108 formed on the upper surface of the printed circuit board 102 may be referred to as the first encapsulation resin 108A, and the encapsulation resin 108 formed on the lower surface may be referred to as the second encapsulation resin 108B.

In the example embodiment of FIG. 4, the solder balls 110 may be covered (e.g., fully covered) with the second encapsulation resin 108B. Covering the solder balls 110 with the second encapsulation resin 108B may increase an adhesion force of the solder balls to the second surface of the printed circuit board 102. The second encapsulation resin 108B may function as a buffer layer mitigating a level of stress applied to the solder balls 110, for example, when defects such as cracks arise by stress that acts in a horizontal direction due to a difference between coefficients of thermal expansion after the solder balls 110 may be attached to a board. Thus, a severity and/or quantity of defects caused due to adhesion failure may be reduced. Further, the second encapsulation resin 108B may surround (e.g., fully surround) the FBGA package 100A, which may reduce occurrence of detachment of the solder balls 110 when handling the FBGA package 100A.

In the example embodiment of FIG. 4, the first encapsulation resin 108A may reduce defects of the solder balls 110 and may further secure the solder balls 110 in position. Accordingly, sizes of the solder balls 110 may be further reduced with less risk of unacceptable process defect levels. For example, conventional solder balls may be fabricated at 350 μm, while solder balls according to an example embodiment of the present invention may have a diameter less than 350 μm (e.g., in a range of 200 through 340 μm). Accordingly, a fabrication density of solder balls 110 may be increased.

In the example embodiment of FIG. 4, the FBGA package 100A and a board (not shown) may be electrically connected via the grooved connections 112 and connection pins, instead of adhesion of the solder balls as in the conventional art.

In the example embodiment of FIG. 4, D1 may denote a thickness of the second encapsulation resin 108B covering outer surfaces of the solder balls 110. In an example, D1 may range from 50 through 150 μm. D2 may denote a depth of the grooved connections 112 formed by cutting the encapsulation resin 108B and the solder balls 110. In an example, D2 may range from 30 to 70% of the diameter of the solder balls.

Figure 5:
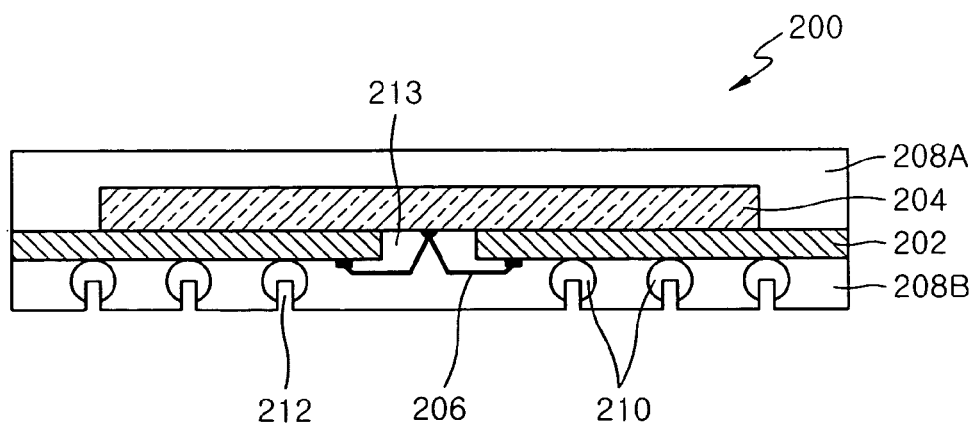
FIG. 5 is a cross-sectional view illustrating a wire bonded BGA (WBGA) package according to another example embodiment of the present invention.

FIG. 5 is a cross-sectional view illustrating a wire bonded BGA (WBGA) package according to another example embodiment of the present invention. Certain elements present in the example embodiment of FIG. 5 may be similar to those described above with respect to FIG. 4, and as such the description of the recurring elements has been omitted for the sake of brevity. For example, the encapsulation resin 208A may be the same as the encapsulation resin 108A as above described with respect to FIG. 4, and so on.

In the example embodiment of FIG. 5, the WBGA package 200 may be a WBGA package instead of a FBGA package as illustrated in FIG. 4. A second encapsulation resin 208B may be formed to cover solder balls 210 (e.g., as indicated by D1 in FIG. 4). Grooved connections 212 may be formed in both the second encapsulation resin 208B and the solder ball 210. A printed circuit board 202 may include a central slit 213. A semiconductor chip 204 may include a central pad for wire-bonding. A wire 206 may connect the central pad of the semiconductor chip 204 to bond fingers on the second surface of the printed circuit board 202 at an edge of the slit 213 through the slit 213 of the printed circuit board 202.

Figure 6:
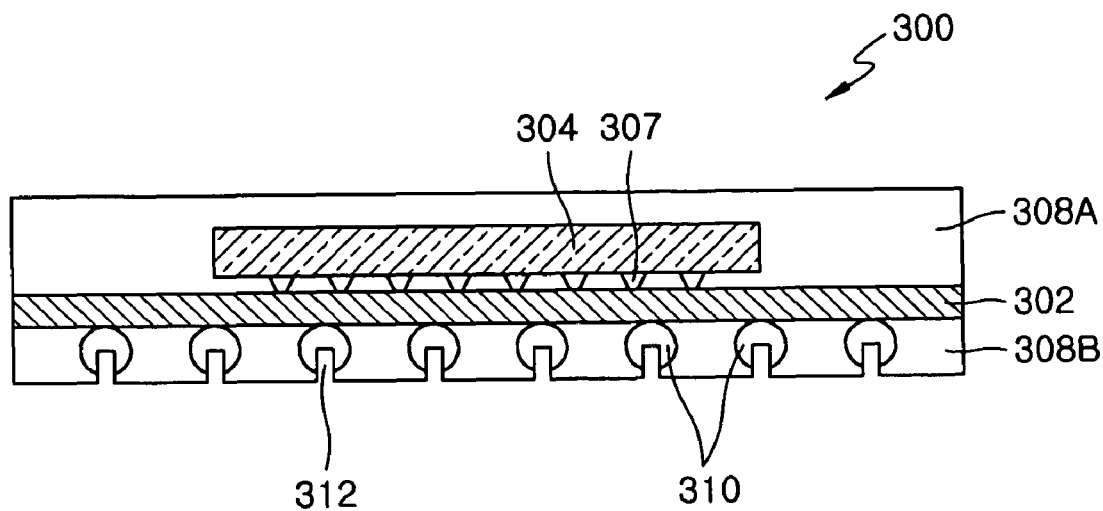
FIG. 6 is a cross-sectional view illustrating a bump BGA package according to another example embodiment of the present invention.

FIG. 6 is a cross-sectional view illustrating a bump BGA package 300 according to another example embodiment of the present invention.

In the example embodiment of FIG. 6, the BGA package 300 may be embodied as a bump BGA package instead of an FBGA package as in FIG. 4 or a WBGA package as in FIG. 5. The BGA package 300 may include solder balls 310 which may be covered with a second encapsulation resin 308B. The BGA package 300 may further include grooved connections 312 formed in both the second encapsulation resin 308B and the solder balls 310. Here, bumps 307 (e.g., not wires) may be used as connections to provide electrical connections between a printed circuit board 302 and a semiconductor chip 304. In an example, the bumps 307 may include at least one of solder and gold (Au).

Figure 7:
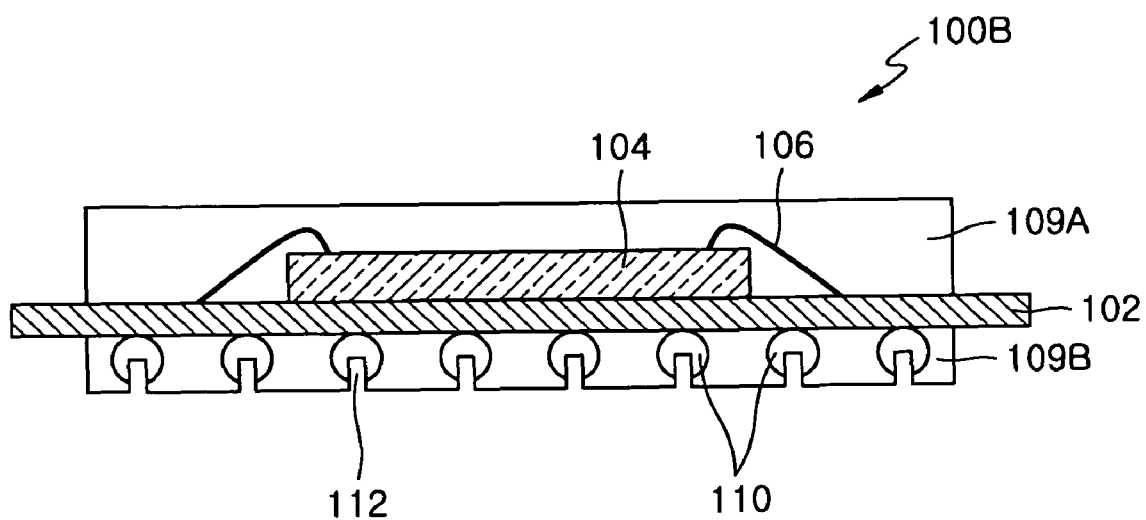
FIGS. 7 and 8 are a cross-sectional view and a plan view, respectively, illustrating a BGA package according to another example embodiment of the present invention.

In the example embodiments of FIGS. 4-7, the encapsulation resins 108, 208 and 308 may have the same sizes as those of the printed circuit boards 102, 202 and 302. As will now be described in greater detail, FIGS. 7 and 8 illustrate a BGA package with resin formed with a size smaller than a printed circuit board depth.

Figure 8:
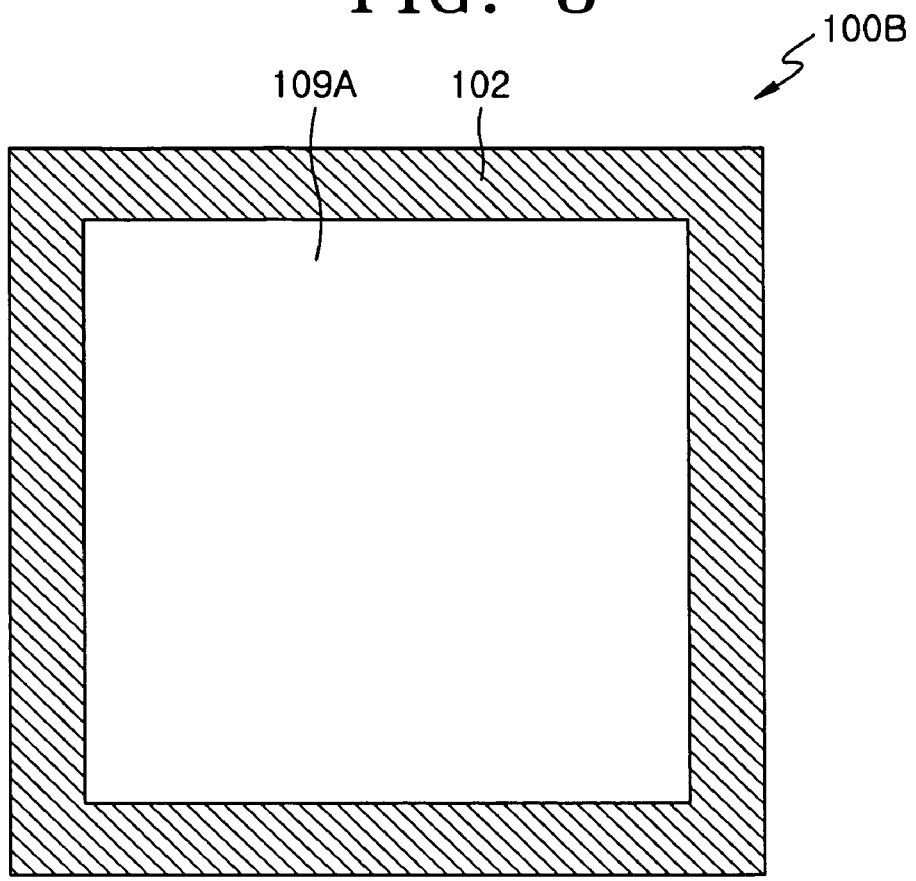

FIGS. 7 and 8 are a cross-sectional view and a plan view, respectively, illustrating a BGA package 100B according to another example embodiment of the present invention.

In the example embodiments of FIGS. 7 and 8, the BGA package 100B may include encapsulation resins 109A and 109B with sizes smaller than the printed circuit boards 102, 202 and 302. In other words, the printed circuit boards 102/202/302 may extend or protrude beyond the encapsulation resins 109A and 109B. In an example, the second encapsulation resin may be formed after the first encapsulation resin 109A is formed. In an alternative example, if the solder balls 110 are all attached, the first encapsulation resin 109A may be formed after the second encapsulation resin 109A is formed.

Figure 9:
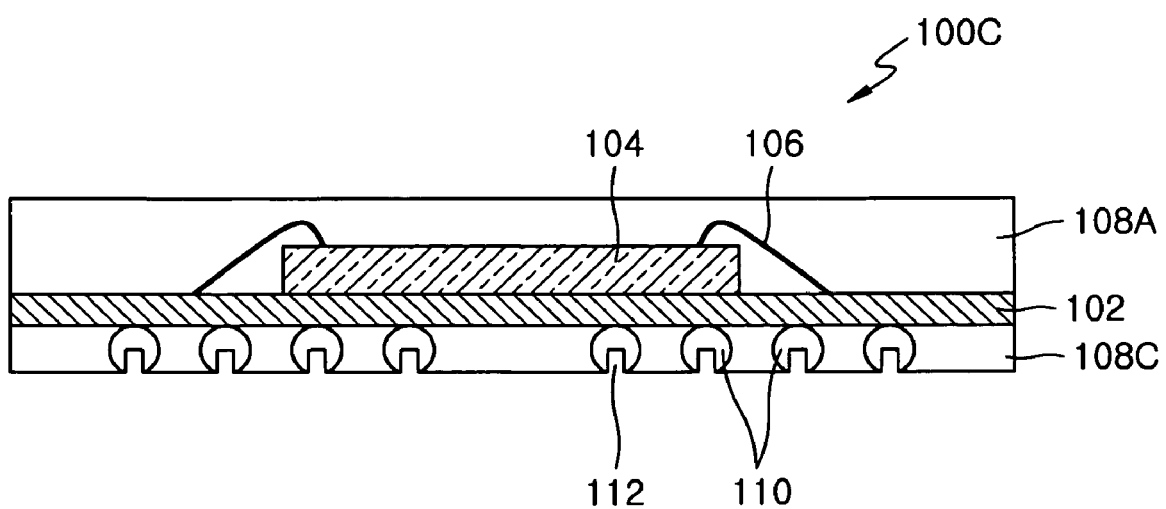
FIG. 9 is a cross-sectional view illustrating a BGA package according to another example embodiment of the present invention.

FIG. 9 is a cross-sectional view illustrating a BGA package 100C according to another example embodiment of the present invention.

In the example embodiment of FIG. 9, the BGA package 100C may include a second encapsulation resin 108C which may cover the solder balls 110 to a thickness less than D1 as in FIG. 4. For example, the second encapsulation resin 108C may cover the solder balls 110 to a thickness substantially equal to the height or depth of the solder balls 110. Thus, in this example, it will be appreciated that D1 may become substantially equal to zero.

Figure 10:
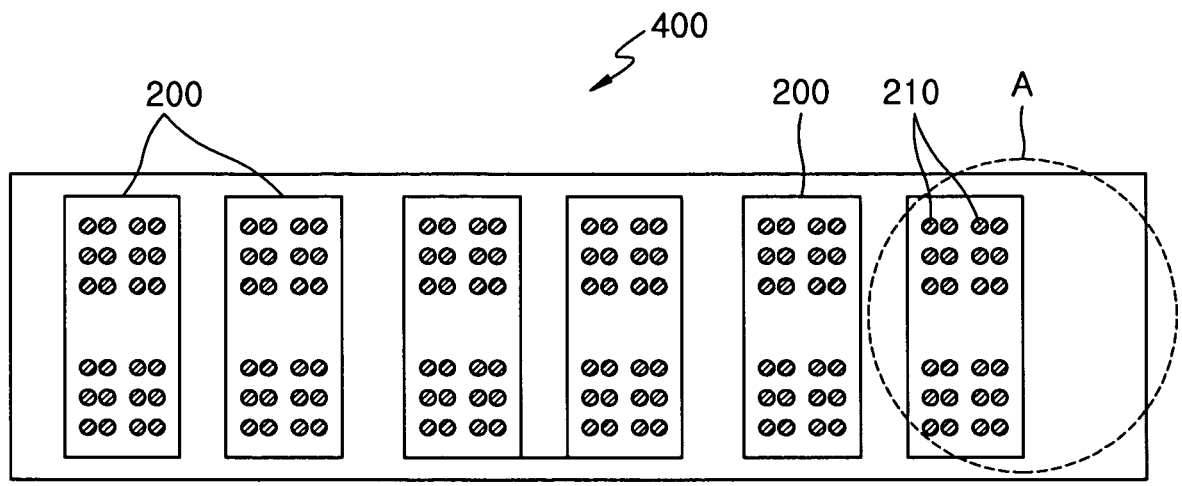
FIG. 10 is a plan view illustrating a process of forming grooved connections as lanes in the WBGA package of FIG. 5 according to another example embodiment of the present invention.

FIG. 10 is a plan view illustrating a process of forming grooved connections as lanes in the WBGA package 200 of FIG. 5 according to another example embodiment of the present invention.

Figure 11:
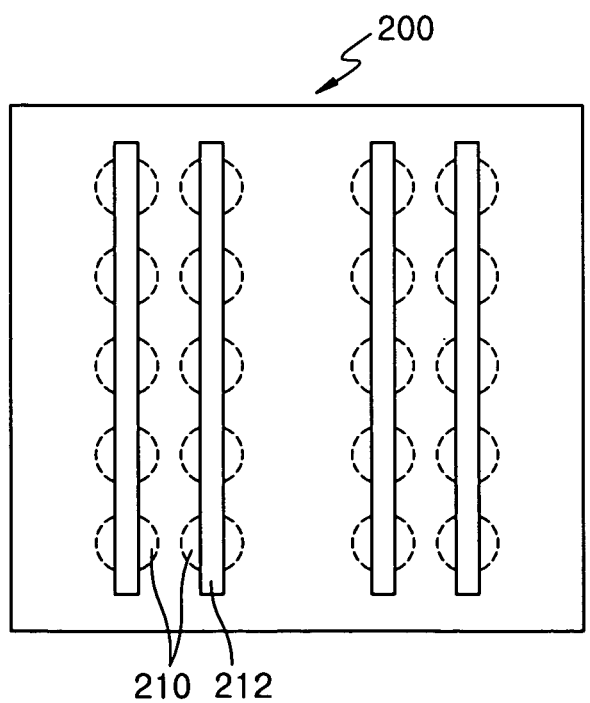
FIG. 11 is a plan view illustrating a lane made in the process of FIG. 10 according to another example embodiment of the present invention.

FIG. 11 is a plan view illustrating a lane made in a portion, A, of FIG. 10, according to another example embodiment of the present invention.

Figure 12:
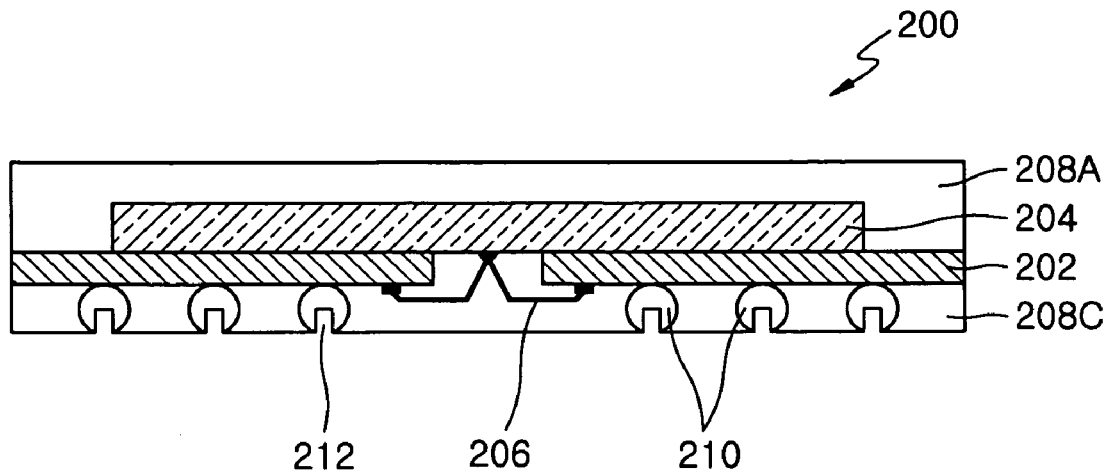
FIG. 12 is a cross-sectional view illustrating the WBGA package with grooved connections after the process of FIG. 10.

FIG. 12 is a cross-sectional view illustrating the WBGA package 200 with grooved connections after the process of FIG. 10.

In the example embodiments of FIGS. 10 through 12, a plurality of WBGA packages 200 (e.g., described above with respect to FIG. 5) may be assembled in a strip 400. After the second encapsulation resin is formed as described above with respect to other example embodiments of the present invention, grooved connections 212 may be formed in the form of a lane at a position corresponding to positions of the solder balls 210 using a cutting tool such as a blade. In an example, the grooved connections 212 may be formed by cutting the solder balls 210 to a depth ranging from 30 to 70% of the diameter of the solder balls 210 and cutting the second encapsulation resin 208C to the same depth at a position corresponding to the position of the lane. In another example, the second encapsulation resin 208C may be formed to the same thickness as that of the solder balls 210 (e.g., see FIG. 9).

Figure 13:
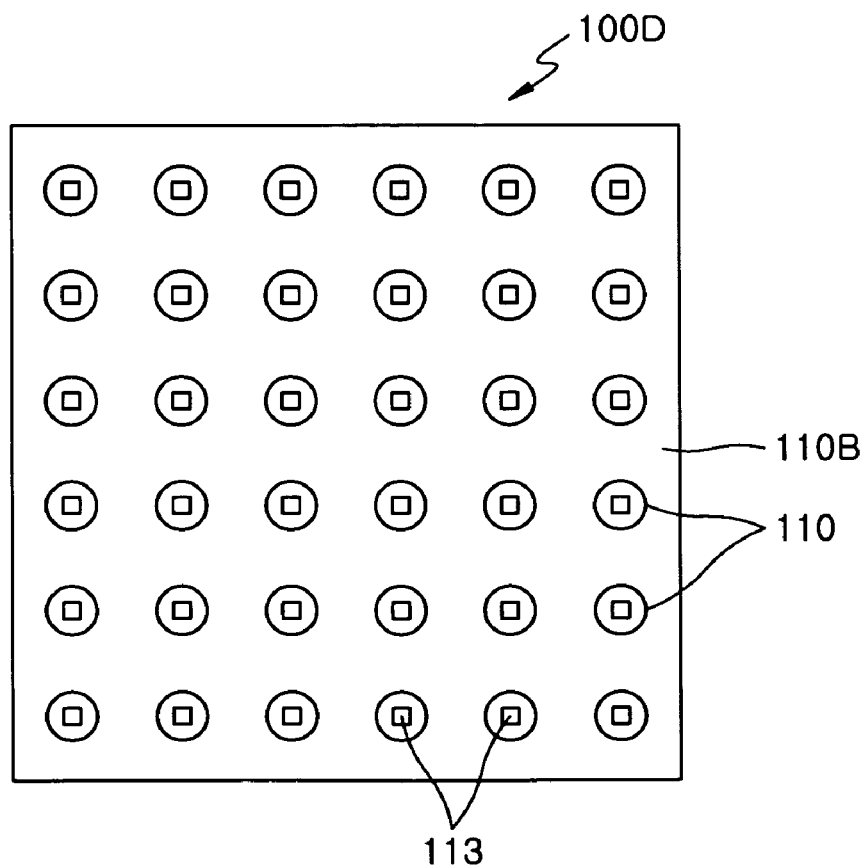
FIG. 13 is a plan view illustrating a BGA package according to another example embodiment of the present invention.

FIG. 13 is a plan view illustrating a BGA package 100D according to another example embodiment of the present invention.

In the example embodiment of FIG. 13, the BGA package 100D may include grooved connections 212 in the form of holes 113 (e.g., not a lane as described in the example embodiments of FIGS. 10-12). In an example, the holes 113 may be formed by punching a second encapsulation resin 108B and solder balls 110 through laser drilling. While the holes 113 are illustrated as having a rectangular shape, the holes 113 may be embodied with different shapes in other example embodiments of the present invention, such as a circular shape.

Figure 14:
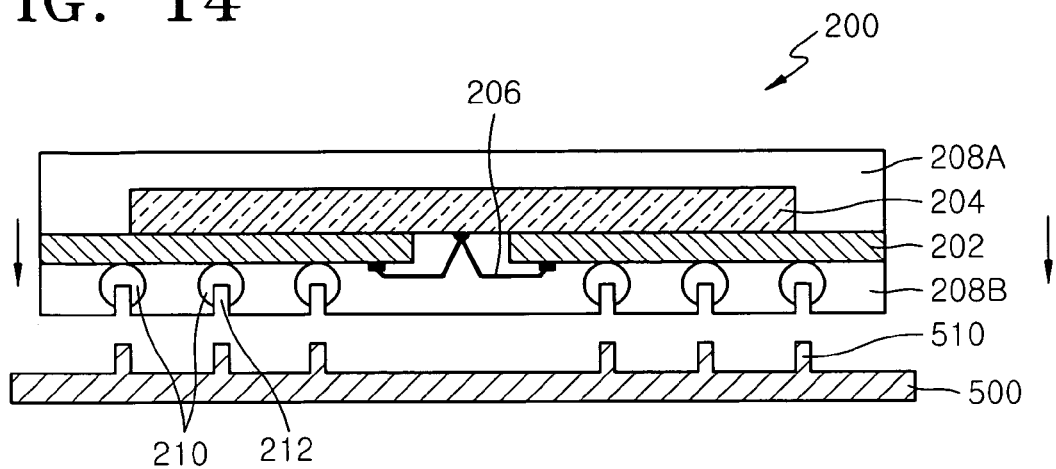
FIG. 14 is a cross-sectional view illustrating the WBGA package of FIGS. 5 and 12 being mounted on a board according to another example embodiment of the present invention.

FIG. 14 is a cross-sectional view illustrating the WBGA package 200 of FIGS. 5 and 12 being mounted on a board 500 according to another example embodiment of the present invention.

In the example embodiment of FIG. 14, the board 500 may include protruding connection pins 510 disposed in regions corresponding to positions of solder balls of the BGA package 200 of FIGS. 5 and/or 12. The BGA package 200 may be mounted on the board 500 by aligning grooved connections 212 of the solder balls 210 with corresponding protruding connection pins 510. A stress buffer layer 208B may fill a space between the board 500 and the BGA package 200 after the mounting.

In the example embodiment of FIG. 14, the stress buffer layer 208B may be embodied as an insulating layer, as above described with respect to the second encapsulation resin. In an example, the stress buffer layer 208B may include an epoxy mold compound (EMC) as described above with respect to the example embodiments of FIGS. 4 through 9. The grooved connections 212 may be embodied as either a lane or a hole. Accordingly, because the stress buffer layer 208B may be formed in the process of fabricating the BGA package 200, further under-fill material need not to be filled after the BGA package 200 may be mounted on the board 500.

Figure 15:
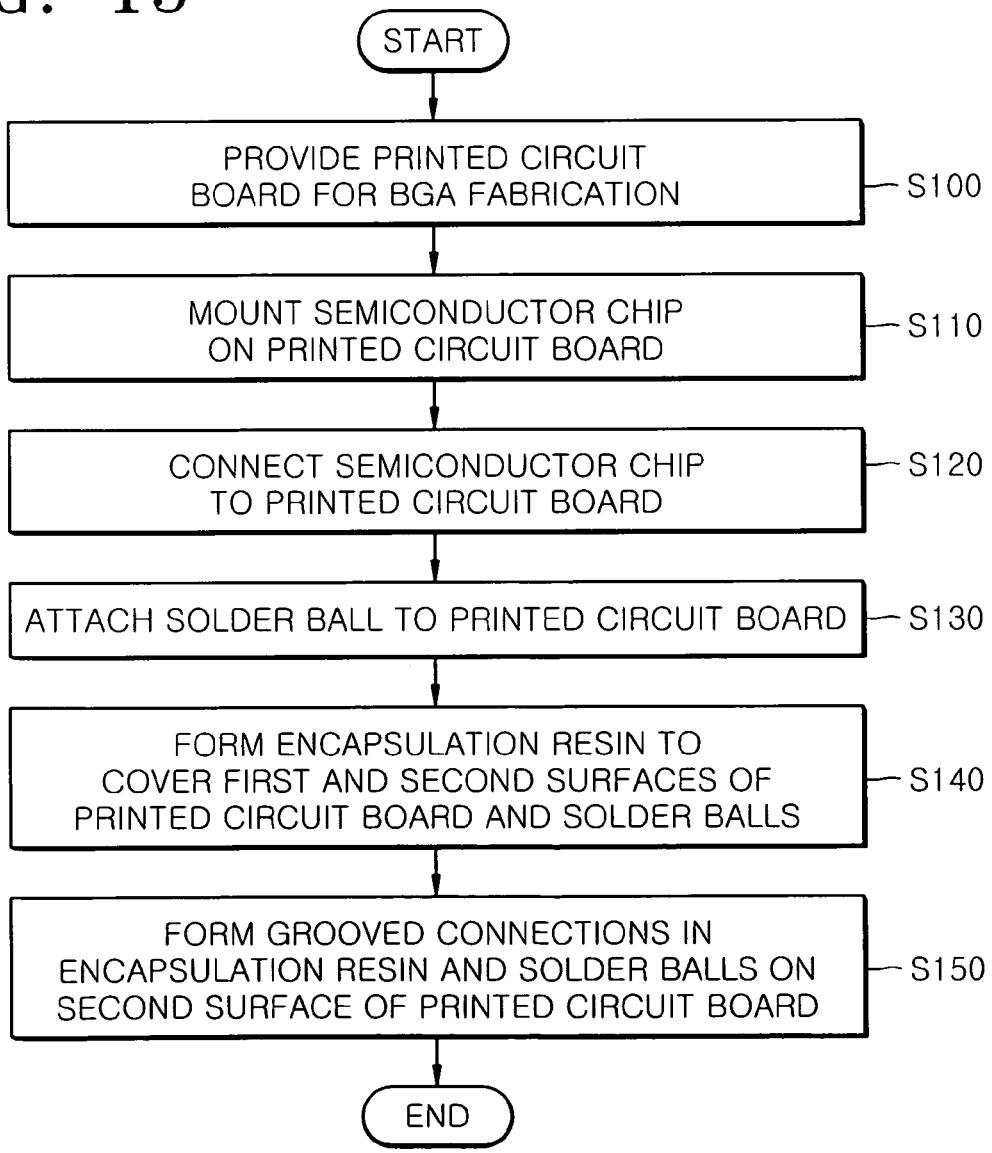
FIG. 15 is a flowchart illustrating a BGA package fabrication process according to another example embodiment of the present invention.

FIG. 15 is a flowchart illustrating a BGA package fabrication process according to another example embodiment of the present invention.

In the example embodiment of FIG. 15, a printed circuit board (e.g., printed circuit board 102, 202, 302, etc.) for BGA fabrication may be provided (at S100). In an example, the printed circuit board may be a printed circuit board compatible with FBGA, WBGA and/or bump BGA packages. A semiconductor chip may be mounted on the printed circuit board (at S110) and the semiconductor chip may be connected to the printed circuit board through one or more connections (at S120). In an example, the connections (at S120) may include wires and/or bumps.

In the example embodiment of FIG. 15, solder balls may be attached to the second surface (e.g., a lower surface) of the printed circuit board (at S130) and an encapsulation resin may be molded to cover (e.g., fully cover) the first surface (e.g., an upper surface) of the printed circuit board and the solder balls on the second surface (at S140). In an example, the encapsulation resins may be formed on both of the upper and lower (e.g., first and second) surfaces of the printed circuit board (e.g., at the same time, sequentially, etc.). Further, in an example, the encapsulation resin on the lower surface may cover the solder balls to a thickness of 50 through 150 μm from the solder balls. In an alternative example, the encapsulation resin on the lower surface may equal the height (e.g., the depth, the thickness, etc.) of the solder balls.

In the example embodiment of FIG. 15, grooved connections may be formed in the encapsulation resin on the second surface of the printed circuit board, each of which may be embodied in a given form (e.g., a lane or a hole) having a given depth (e.g., 30% through 70% of a diameter of the solder balls) (at S150).

In another example embodiment of the present invention, solder balls may be more firmly attached onto a printed circuit board during BGA package fabrication and greater amounts of stress may be absorbed by covering an outer wall of the solder balls with EMC, such that defects (e.g., cracks of the solder balls) may be reduced. Also, a likelihood of solder balls detaching from their positions during processing (e.g., fabrication, handling after fabrication, etc.) may be reduced by covering the outer surface of the solder balls with EMC. Further, solder balls may be fabricated at greater densities due to the reduced defects because smaller fabrication sizes may be possible.

Example embodiments of the present invention being thus described, it will be obvious that the same may be varied in many ways. For example, while numerous specific examples of semiconductor packages are described above (e.g., WBGA, FBGA, bump BGA, etc.), it is understood that other example embodiments of the present invention may be applied towards any semiconductor packaging technology.

Such variations are not to be regarded as a departure from the spirit and scope of example embodiments of the present invention, and all such modifications as would be obvious to one skilled in the art are intended to be included within the scope of the following claims.

What is claimed is:

1. A ball grid array (BGA) package, comprising:
    a semiconductor chip mounted on a first surface of a printed circuit board;
    a connection element connecting the printed circuit board to the semiconductor chip;
    a plurality of solder balls attached to a second surface of the printed circuit board, each of the plurality of solder balls including a preformed grooved connection formed on a surface of the plurality of solder balls opposite the second surface of the printed circuit board;
    an encapsulation resin covering one or more of the printed circuit board, the semiconductor chip, the connection element, and the solder balls, wherein
        the encapsulation resin includes a first encapsulation resin on the first surface of the printed circuit board and a second encapsulation resin on the second surface of the printed circuit board, and
        a thickness of the second encapsulation resin is greater than a height of the solder balls.

2. The BGA package of claim 1, wherein the plurality of grooved connections are formed by cutting an end of each of the plurality of solder balls.

3. The BGA package of claim 1, wherein the BGA package is one selected from a group consisting of a wire bonded BGA (WBGA), a fine pitch BGA (FBGA) and a bump BGA package.

4. The BGA package of claim 1, wherein the connection element is one of a gold wire and a bump.

5. The BGA package of claim 1, wherein the encapsulation resin includes epoxy mold compound (EMC).

6. The BGA package of claim 1, wherein the second encapsulation resin covers the solder balls to a thickness ranging from 50 to 150 μm from a surface of the solder balls.

7. The BGA package of claim 1, wherein the grooved connections are in the form of either a lane or a hole.

8. The BGA package of claim 1, wherein the printed circuit board extends beyond the encapsulation resin.

9. The BGA package of claim 1, wherein the encapsulation resin and printed circuit board extend to substantially the same degree.

10. The BGA package of claim 1, wherein each of the plurality of solder balls have a diameter between 200 through 340 μm.

11. A board structure, comprising:
a board including a plurality of protruded connection pins, the protruded connection pins configured to be insertable into corresponding preformed grooved connection portions of solder balls of a ball-grid array (BGA) package, and
a stress buffer layer filling between the board and the BGA package, the stress buffer layer includes a grooved connection portion formed therein corresponding to the grooved connection portion of the solder balls, wherein a thickness of the stress buffer layer is greater than a height of the solder balls.

12. The board structure of claim 11, further comprising:
the BGA package mounted on the board and including the solder balls with the grooved connections corresponding to the protruded connection pins.

13. The board of claim 11, wherein the stress buffer layer is an insulating layer.

14. The board of claim 11, wherein the stress buffer layer includes an epoxy mold compound (EMC).

15. The board of claim 11, wherein the stress buffer layer is formed during fabrication of the BGA package.

16. The board of claim 11, wherein the solder balls of the BGA package are covered with an epoxy mold compound (EMC).

17. The board of claim 11, wherein the grooved connections are at least one of a lane and a hole.

18. A method fabricating the BGA package of claim 1.

* * * * *